US011043483B2

(12) United States Patent
Hwang et al.

(10) Patent No.: US 11,043,483 B2
(45) Date of Patent: Jun. 22, 2021

(54) SEMICONDUCTOR DEVICE IN A LEVEL SHIFTER WITH ELECTROSTATIC DISCHARGE (ESD) PROTECTION CIRCUIT AND SEMICONDUCTOR CHIP

(71) Applicant: Magnachip Semiconductor, Ltd., Cheongju-si (KR)

(72) Inventors: Kyong Jin Hwang, Cheongju-si (KR); Hyun Kwang Jeong, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/050,523

(22) Filed: Jul. 31, 2018

(65) Prior Publication Data

US 2018/0358349 A1     Dec. 13, 2018

Related U.S. Application Data

(60) Continuation of application No. 15/626,263, filed on Jun. 19, 2017, now Pat. No. 10,068,892, which is a
(Continued)

(30) Foreign Application Priority Data

Mar. 13, 2015   (KR) .......................... 10-2015-0034921

(51) Int. Cl.
| | |
|---|---|
| *H01L 27/02* | (2006.01) |
| *H01L 29/423* | (2006.01) |
| *H01L 29/78* | (2006.01) |
| *H01L 29/49* | (2006.01) |
| *H01L 29/66* | (2006.01) |

(Continued)

(52) U.S. Cl.
CPC .... *H01L 27/0248* (2013.01); *H01L 21/28052* (2013.01); *H01L 27/0255* (2013.01); *H01L 27/0288* (2013.01); *H01L 27/0629* (2013.01); *H01L 29/42368* (2013.01); *H01L 29/435* (2013.01); *H01L 29/4916* (2013.01); *H01L 29/4933* (2013.01); *H01L 29/66659* (2013.01); *H01L 29/66681* (2013.01); *H01L 29/7816* (2013.01); *H01L 29/7833* (2013.01); *H01L 29/7835* (2013.01); *H03K 19/00361* (2013.01);
(Continued)

(58) Field of Classification Search
None
See application file for complete search history.

(56) References Cited

U.S. PATENT DOCUMENTS 4,829,344 A    5/1989  Bertotti et al.
5,314,834 A *  5/1994  Mazure ............ H01L 29/42368
                                                  257/324
(Continued)

*Primary Examiner* — Andres Munoz
(74) *Attorney, Agent, or Firm* — NSIP Law

(57) ABSTRACT

The present disclosure relates to a semiconductor chip having a level shifter with electro-static discharge (ESD) protection circuit and device applied to multiple power supply lines with high and low power input to protect the level shifter from the static ESD stress. More particularly, the present disclosure relates to a feature to protect a semiconductor device in a level shifter from the ESD stress by using ESD stress blocking region adjacent to a gate electrode of the semiconductor device. The ESD stress blocking region increases a gate resistance of the semiconductor device, which results in reducing the ESD stress applied to the semiconductor device.

11 Claims, 16 Drawing Sheets

Related U.S. Application Data division of application No. 14/803,976, filed on Jul. 20, 2015, now Pat. No. 9,721,941.

(51) Int. Cl.
*H01L 21/28* (2006.01)
*H01L 29/43* (2006.01)
*H01L 27/06* (2006.01)
*H03K 19/003* (2006.01)
*H03K 19/0185* (2006.01)
*H01L 29/06* (2006.01)
*H01L 29/861* (2006.01)

(52) U.S. Cl.
CPC .. *H03K 19/018507* (2013.01); *H01L 29/0692* (2013.01); *H01L 29/861* (2013.01)

(56) References Cited

U.S. PATENT DOCUMENTS

| | | | |
|---|---|---|---|
| 5,918,133 A * | 6/1999 | Gardner | H01L 21/26506 438/299 |
| 5,932,919 A * | 8/1999 | Schwalke | H01L 21/823842 257/369 |
| 6,255,175 B1 * | 7/2001 | Yu | H01L 21/26586 257/E21.196 |
| 6,441,431 B1 | 8/2002 | Efland et al. | |
| 6,707,112 B2 | 3/2004 | Kachelmeier | |
| 6,744,101 B2 | 6/2004 | Long et al. | |
| 6,765,772 B2 | 7/2004 | Lee et al. | |
| 6,888,205 B2 * | 5/2005 | Moscatelli | H01L 21/28167 257/406 |
| 7,176,530 B1 * | 2/2007 | Bulucea | H01L 21/823807 257/369 |
| 8,101,479 B2 | 1/2012 | Parker et al. | |
| 8,203,188 B2 | 6/2012 | Ito | |
| 9,123,807 B2 | 9/2015 | Ito | |
| 9,613,948 B1 | 4/2017 | Wang et al. | |
| 9,721,941 B2 * | 8/2017 | Hwang | H01L 29/42368 |
| 10,068,892 B2 * | 9/2018 | Hwang | H01L 29/42368 |
| 2002/0149064 A1 * | 10/2002 | Ballantine | H01L 21/28035 257/385 |
| 2004/0219733 A1 * | 11/2004 | Algotsson | H01L 21/8249 438/202 |
| 2007/0090414 A1 * | 4/2007 | Sutou | H01L 27/0266 257/277 |
| 2007/0181941 A1 | 8/2007 | Lin et al. | |
| 2008/0023767 A1 * | 1/2008 | Voldman | H01L 27/0255 257/355 |
| 2008/0164537 A1 | 7/2008 | Cai | |
| 2008/0179749 A1 * | 7/2008 | Anderson | H01L 21/28052 257/756 |
| 2009/0001477 A1 * | 1/2009 | Hsu | H01L 21/28052 257/380 |
| 2009/0007037 A1 * | 1/2009 | Hsu | H01L 21/28052 716/106 |
| 2012/0161233 A1 | 6/2012 | Ito | |
| 2013/0027823 A1 | 1/2013 | Wu et al. | |
| 2013/0181287 A1 | 7/2013 | Zhang et al. | |
| 2013/0328124 A1 * | 12/2013 | Chou | H01L 29/42364 257/351 |
| 2014/0264576 A1 | 9/2014 | Zhang et al. | |
| 2015/0102405 A1 | 4/2015 | Ryu et al. | |
| 2017/0062554 A1 * | 3/2017 | Tan | H01L 29/0619 |

\* cited by examiner

SEMICONDUCTOR DEVICE IN A LEVEL SHIFTER WITH ELECTROSTATIC DISCHARGE (ESD) PROTECTION CIRCUIT AND SEMICONDUCTOR CHIP

CROSS-REFERENCE TO RELATED APPLICATIONS

This application is a continuation of U.S. patent application Ser. No. 15/626,263, filed on Jun. 19, 2017, which is a divisional of U.S. patent application Ser. No. 14/803,976, filed on Jul. 20, 2015 and claims the benefit under 35 U.S.C. § 119(a) of Korean Patent Application No. 10-2015-0034921, filed on Mar. 13, 2015 in the Korean Intellectual Property Office, the entire disclosure of which is incorporated herein by reference for all purposes.

BACKGROUND

1. Field

The following description relates to a semiconductor device in a level shifter with an electrostatic discharge protection circuit and semiconductor chip to protect a thin gate oxide of the semiconductor device from an Electrostatic Discharge (hereinafter referred to as "ESD") stress.

2. Description of Related Art

A level shifter refers to a circuit configured to change a voltage level of a semiconductor chip interior like a Display Drive IC (DDI). For example, the level shifter converts a low voltage signal to a middle or high voltage signal. Thus, the level shifter is positioned between multiple power supply lines with high and low power input.

A semiconductor device in a level shifter is placed in a level shifter block that may not provide enough driving current because a gate input voltage is a low voltage. This is because there is a limit in increasing a driving current since a thick gate insulating layer is used.

Accordingly, a semiconductor device in a level shifter with a thin gate insulating layer may be used but such semiconductor device in a level shifter is vulnerable to an ESD stress. Because, when ESD stress or Electrical Over-Stress (hereinafter referred to as "EOS") is applied to the semiconductor device in a level shifter, a thin gate insulating layer is easily destroyed. Hence, an ESD protection circuit and device is necessary to prevent or block the ESD stress of a semiconductor device in a level shifter.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present disclosure has been made in an effort to provide an electrostatic discharge protection circuit and device to protect a thin gate insulating layer by blocking electrostatic discharge (ESD) stress.

Further, the present disclosure provides an electrostatic discharge protection circuit and device wherein reduces the ESD stress by increasing gate resistance of the semiconductor device in a level shifter.

Further, the present disclosure provides an electrostatic discharge protection circuit and device to efficiently protect the level shift block that a core device from the ESD stress by helping discharge of the ESD stress by adding a back-to-back diode.

An electrostatic discharge protection circuit and device applied on a multiple power supply lines with high and low power input according to an embodiment of the present disclosure adds a resistor on a gate used in a semiconductor device in a level shifter, thereby relieve an ESD or EOS stress. Accordingly, there is an effect of preventing a thin gate insulating layer of the semiconductor device in a level shifter.

Further, core devices are protected from the ESD stress by easily discharging the ESD stress through interconnecting a back-to-back diode to a ground line.

Thus, the semiconductor device in a level shifter with feature resistant to the ESD stress and various noises may be formed.

Figure 1A:
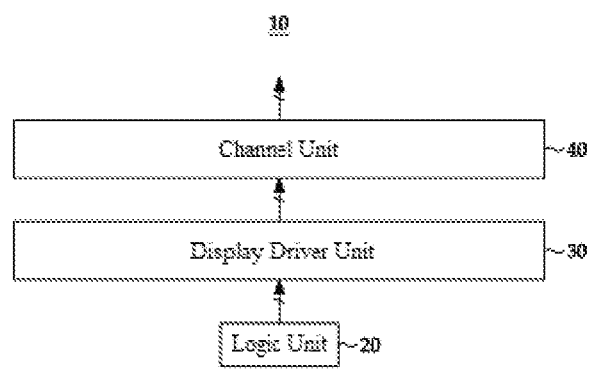
FIG. 1A is a block diagram of a DDI chip including a display driving unit of the present disclosure.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, an embodiment of the present disclosure is described in detail referring to the attached drawings.

Figure 1B:
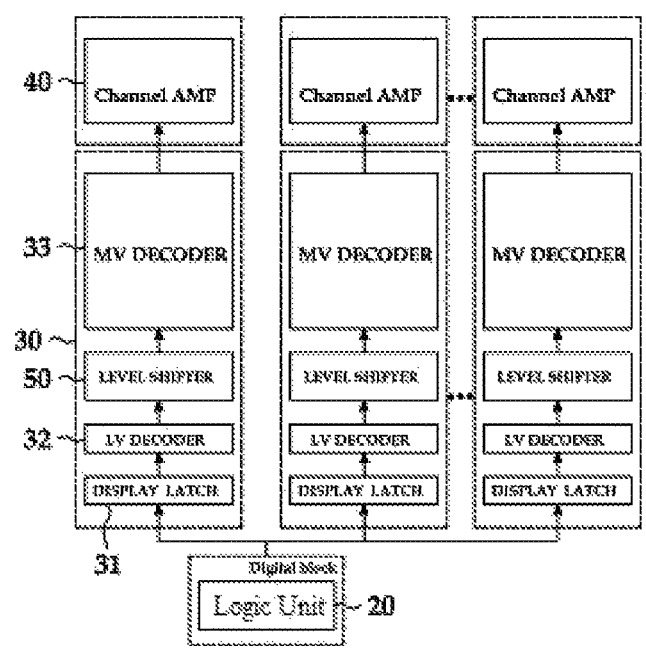
FIG. 1B is a detail DDI block diagram of the present disclosure.

FIGS. 1A and 1B are a block diagram of a DDI 10 including a display driving unit 30 illustrating an embodiment of the present disclosure.

A Display Drive IC (DDI) 10 is an IC required for driving a display panel that electrically provides a driving signal and data to a display panel for word or image display on screen.

The DDI providing such function includes a logic unit (main logic) 20, a display driving unit 30 and a channel unit 40 as illustrated in FIG. 1A. Additionally, the display driving unit 30 and the channel unit 40 are provided according to a number of channels based on a screen resolution. One logic unit 20 controls the operation of the display driving unit 30 and the channel unit 40 respectively. In other words, the display driving unit 30 transmits a decoded signal to respective channels of the channel unit 40 according to a control signal of a logic unit 20.

FIG. 1B is a detail block diagram of FIG. 1. Referring to FIG. 1B, a display driving unit 30 and a channel unit 40 are formed according to a number of channels. For example, when a number of channel is 2016, a number of display driving unit 30 and channel unit 40 are also 2016.

The display driving unit 30 comprises a latch unit 31, a first decoder 32, a level shifter 50 and a second decoder 33. The latch unit 31 latches a driving signal received from a logic section 20 and a data latched all at once, a first decoder 32 decoded a low voltage level, a second decoder 33 decodes a middle voltage. A level shifter 50 placed between the first decoder 32 and the second decoder 33 converts the voltage level. In other words, the level shifter 50 is a circuit converting voltage levels in a semiconductor IC like DDI. For example, voltage level of 1.2V is converted to voltage level 7.7V. Accordingly, the first decoder 32 decodes voltage of 1.2V and transmits to a level shifter 50 and the second decoder 33 transmits 7.7V voltage converted by the level shifter 50 to a channel 40 connected to a back terminal.

Figure 2A:
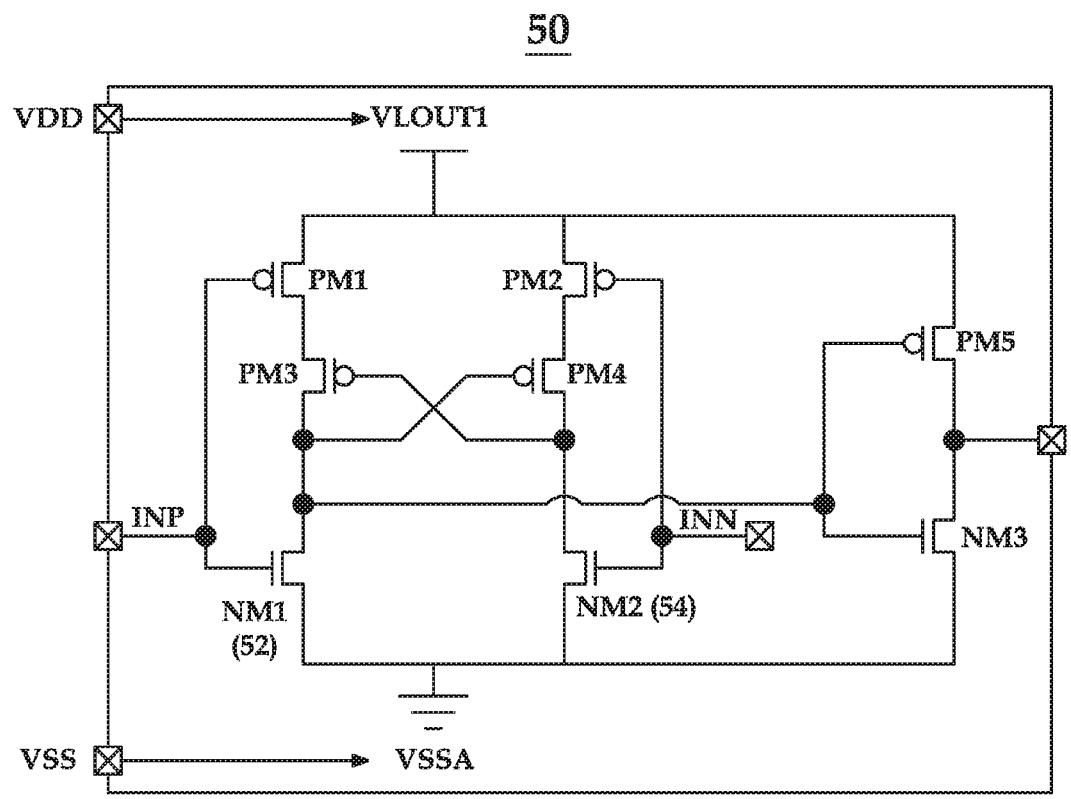
FIG. 2A is a level shifter diagram including a semiconductor device in the present disclosure.

FIG. 2A is a circuit diagram regarding a level shifter 50 block illustrated in FIG. 1. Referring to a level shifter 50 structure of FIG. 2A, an input terminal (INN or INP) of the level shifter 50 is connected to a first NMOS (NM1) 52 and a second NMOS (NM2) 54. The first NMOS (NM1) 52 and the second NMOS (NM2) 54 have differential inputs (INN, INP) as gate inputs respectively and one terminal of a main current path has a common connection with a ground terminal (GND). Furthermore, respective terminals of respective main current path are connected to respective outputs (OUTN, OUTP).

Herein, when the first NMOS 52 and the second NMOS 54 are formed as a transistor of a high voltage device structure as afore-mentioned, design area of a level shift block increases, thereby a size of a DDI also increases. Accordingly, an embodiment of the present disclosure aims to configure the transistor positioned on an input terminal of the level shifter as a LDMOS or EDMOS to minimize an area of a transistor in a level shifter. In a related art, a middle voltage or a high voltage device including a gate insulating layer with a thick thickness was used, thereby when 0.5-2V is applied to the gate electrode thereof, a drain current (Idsat) is too low so a range of a channel region maybe large. Accordingly, device area becomes large. Thus, an embodiment of the present disclosure requires a level shift semiconductor device that minimizes a size of a semiconductor device with high drain current (Idsat) even when 0.5-2V is applied to a gate electrode. The level shift semiconductor device may use nEDMOS or nLDMOS device. A gate insulating layer of a level shift semiconductor device uses an insulating layer with different thickness contacting with each other. A region with different thickness exits in one gate insulating layer.

Figure 2B:
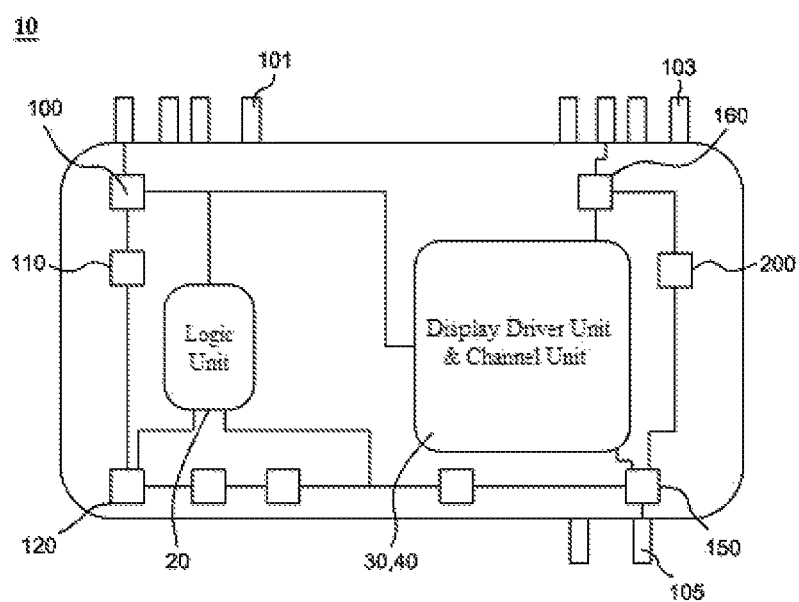
FIG. 2B is a semiconductor chip including a display driving unit with ESD protection circuit of the present disclosure.

FIG. 2B is a semiconductor chip 10 including a display driving unit with ESD protection circuit of the present disclosure. A semiconductor chip 10 is an example of semiconductor chip such as display driver IC (DDI). A semiconductor chip 10 includes any integrated circuit (IC) parts. As illustrated, an embodiment of the present disclosure includes a low voltage input pad (LV-VDD, $1^{st}$ input pad) 100 and a low voltage ground pad (LV-VSS, $1^{st}$ ground pad) 120, a high voltage input pad (HV-VDD, $2^{nd}$ input pad) 160 and, a high voltage ground pad (HV-VSS, $2^{nd}$ ground pad) 150. The input pad and ground pad are arranged around the outmost area of the semiconductor chip 10. A semiconductor chip 10 has multiple power supply lines with high power input 160 and low power input 100. A low voltage or low power (LV) input pad 100 may be connected to an LV input pin 101. An high voltage or high power (HV) input pad 160 may be connected to an HV input pin 103. An high voltage or high power (HV) ground pad 150 may be connected to an ground pin 105. The VDD herein may be seen as a plus input pad, and VSS as a minus input pad. A minus input pad may be used as a ground source.

The semiconductor chip 10 includes the core unit such as logic unit 20, display driver unit 30 and channel unit 40 as mentioned in the FIG. 1. The logic unit 20 is connected to LV input pad 100 and LV ground pad 120. The display driver unit 30 and channel unit 40 are connected together with LV input pad 100, HV input pad 160 and HV output pad (not shown) because the display driver unit 30 includes a level shifter 50 which converts a low voltage signal to a middle or high voltage signal. The ESD clamp 110 protects the logic unit 20, display driver unit 30 and channel unit 40 from ESD event or ESD stress current.

Figure 3:
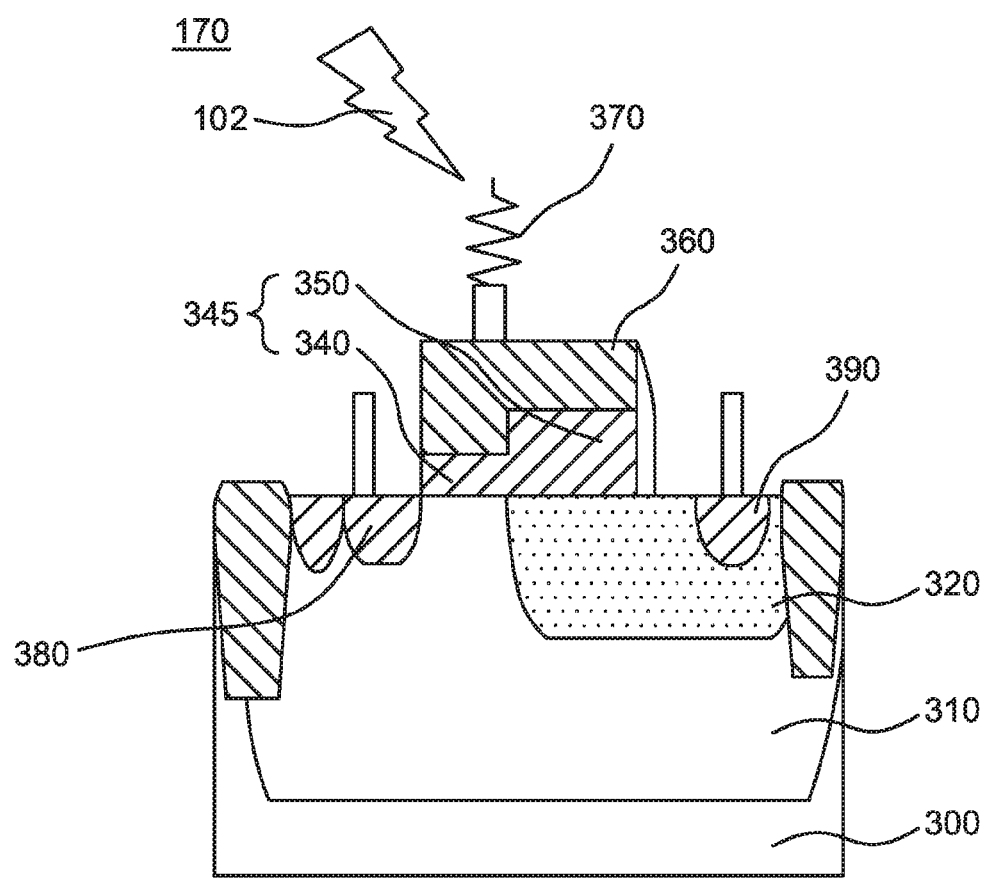
FIG. 3 is a cross-section of a semiconductor device in a level shifter of the present disclosure.

FIG. 3 illustrates a cross-section of a level shift semiconductor device (or referred to as a "semiconductor device") including the gate insulating layer with different thicknesses. The first NMOS 52 and the second NMOS 54 devices illustrated in FIG. 2A may be seen as a semiconductor device 170 in a level shifter which is a cross section thereof. The semiconductor device 170 in a level shifter 175 according to an embodiment of the present disclosure includes gate insulating layers 340, 350 wherein a thin gate insulating layer 340 and a thick gate insulating layer 350 are contacting with each other below a gate electrode 360. In an embodiment of the present disclosure uses the including EDMOS or LEMOS device structures with the above insulating layer.

The semiconductor device 170 according to an embodiment of the present disclosure includes a first conductive type (P type) well region 310 formed on a substrate 300; a second conductive type (N) drain region 390 and a source region 380 formed on the well region 310; a first gate insulating layer 340 arranged proximate to the source region 380; a second gate insulating layer 350 with thickness thicker than the first gate insulating layer 340 and arranged near the drain region 390; a gate electrode 360 arranged on the first and second gate insulating layers 340 and 350; a second conductive type extension drain junction region 320 formed extending to a part of a region of the first gate insulating layer 340 in a direction to a source region 380 from the drain region 390 and overlapping with the gate electrode 360, a gate protection region 370 formed on the gate electrode 360. The gate protection region 370 becomes ESD stress blocking region 210 which is non-silicided poly-silicon layer. Therefore the gate protection region 370 comprises non-silicided poly-silicon layer. No silicide treatment performed on the gate protection region 370.

However, an inflow of an ESD stress 102 with a high voltage or current herein may destroy the thin gate insulating layer 340 of the semiconductor device. When there is no gate protection region 370 connected with the gate electrode 360, the semiconductor device may be more vulnerable to the ESD stress 102. Accordingly, an embodiment of the present disclosure aims to solve this problem. A level shifter 175 comprises a semiconductor device 170 and an ESD stress blocking region. The ESD stress blocking region 210 is disposed adjacent to a gate electrode 360 of the semiconductor device 170.

Figure 4:
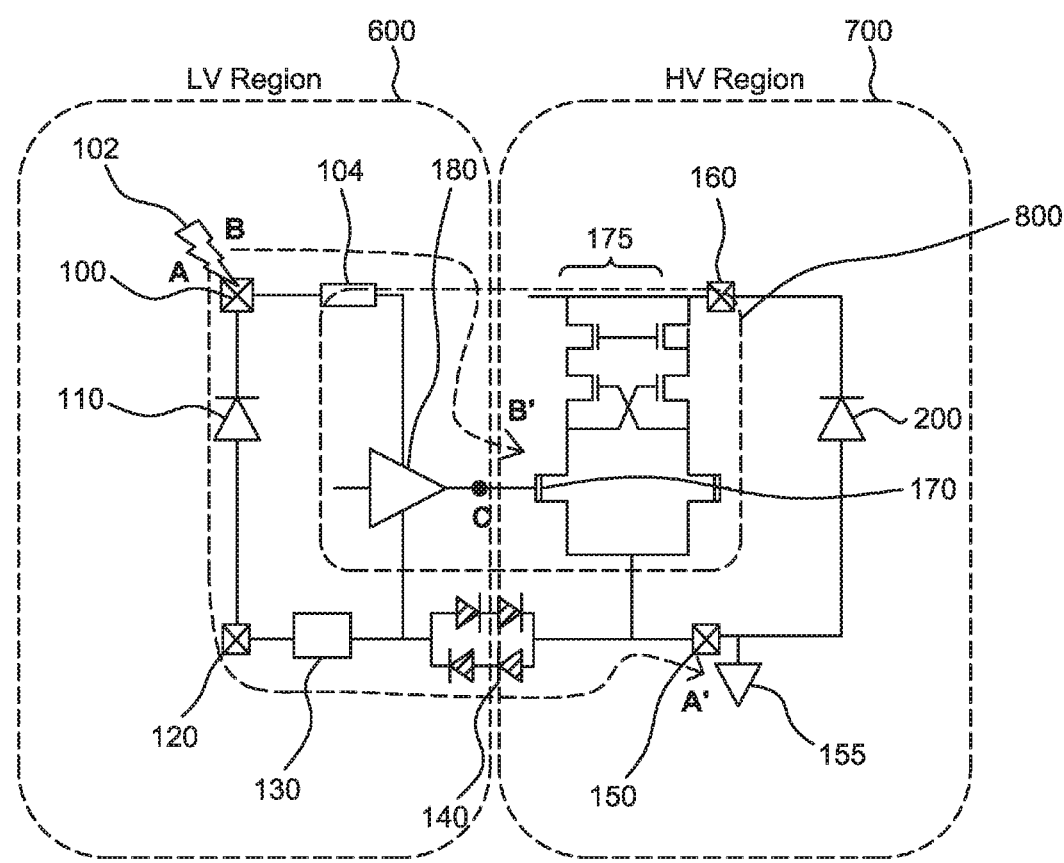
FIG. 4 is a semiconductor chip having a level shifter with an electrostatic discharge protection circuit applied to multiple power supply lines with high and low power input according to an embodiment of the present disclosure.

An embodiment of the present disclosure suggests a semiconductor chip having a level shifter with an ESD circuit according to FIG. 4 to protect the semiconductor device 170. As illustrated, an embodiment of the present disclosure includes a low voltage input pad (LV-VDD, 1$^{st}$ input pad) 100 and a low voltage ground pad (LV-VSS, 1$^{st}$ ground pad) 120, a high voltage input pad (HV-VDD, 2$^{nd}$ input pad) 160 and, a high voltage ground pad (HV-VSS, 2$^{nd}$ ground pad) 150. Herein, an input pad may be connected to an input pin. The VDD herein may be seen as a plus input pad, and VSS as a minus input pad. A minus input pad may be used as a ground source.

A low voltage region 600 comprises the low voltage input pad 100 and a low voltage ground pad 120. A low voltage region 600 also includes logic unit 20 as shown in FIG. 2B. The logic unit contains a plurality of low voltage transistor. A high voltage region 700 comprises the high voltage input pad 160 and high voltage ground pad 150. A high voltage region 700 also includes the display driving unit 30 and the channel unit 40 as illustrated in FIG. 2B. The display driving unit 30 and the channel unit 40 contain a plurality of high voltage transistor. A low voltage transistor with a low input voltage of ~1.8V or ~5V may be formed in the low voltage region. For example, a high voltage transistor with an input voltage of middle voltage or high voltage ranging about 6-30V may be formed. Accordingly, an ESD circuit of an embodiment of the present disclosure is designed under circumstance with two different power sources because low voltage and high voltage input voltages in respectively. Herein, the high voltage ground pad 150 is connected with a ground reference 155. The high voltage region has substantially larger area than the low voltage device region, thereby the high voltage region includes more charged carrier than the low voltage region. Accordingly, it is recommended that the high voltage ground pad 150 rather than low voltage ground pad 120 is connected to the ground reference 155.

Furthermore, as shown in the circuit, a first ESD clamp 110 connected between the low voltage input pad 100 and the low voltage ground pad 120 is arranged. Likewise, a second ESD clamp 200 is also arranged between a high voltage input pad 160 and a high voltage ground pad 150. Accordingly, although the ESD stress 102 flows in the low voltage input pad 100 or the high voltage input pad 160, an embodiment of the present disclosure helps the ESD stress 102 to efficiently outflow to a ground reference 155 through the first ESD clamp 110 and the second ESD clamp 200 passing respective ground pads 120, 150.

The first ESD clamp 110 and the second ESD clamp 200 formed in the circuit of an embodiment of the present disclosure uses a GGNMOS (gate grounded NMOS) or GCNMOS (gate coupled NMOS) or may use a rail based clamping circuit of a RC-triggered big FET form. In other words, it may be various forms of ESD clamp that is a device which can discharge a high ESD current of VDD and VSS therebetween when the ESD stress flows in.

Furthermore, a first resistor 130 and a back to back diode 140 are connected in series between the low voltage ground pad 120 and a high voltage ground pad 150. A back-to-back diode 140 reduces current noise penetrated into the low voltage region provided by the high voltage region and the back-to-back-diode is also applicable to reverse direction, i.e., from low voltage region to the high voltage region. Herein, the first resistor 130 indicates total resistance of metal interconnection interconnection between low voltage ground pad 120 and high voltage ground pad 150.

The ESD design may ensure a current path for output of all stress between an input and output (I/O) pad and interior ground pad (ground connection) because different ground reference is used for noise block of a logic unit and a core unit in an IC design. Accordingly, the diode enables an effective ESD current flow between ground pads (ground connection). The back-to-back diode 140 is provided with the first and second ESD clamps 110, 200 for efficient protection of a core circuit against Many ESD standards such as the Human Body Model (HBM), Machine Model (MM), Charged Device Model (CDM), and IEC 61000-4-2. IEC 61000-4-2 has been developed to test for robustness and ensure ESD under at least 8 kV contact discharge or 15 kV air discharge.

Additionally, an inverter or a buffer (hereinafter referred to as an inverter) 180 is included between the low voltage input pad 100 and the high voltage ground pad 150. The inverter 180 provides an inverter operation to a gate of a semiconductor device 170.

A core circuit or internal circuit 800 is formed between a high voltage input pad 160 and a high voltage ground pad 150 applied with external signal. A level shifter 175 is included in the core circuit or internal circuit 800 and the semiconductor device 170 is included in the level shifter 175. Herein, the semiconductor device 170 corresponds with an NM1 52 and an NM2 54 in the DDI circuit of the afore-mentioned FIG. 2A.

As illustrated in FIG. 4, a semiconductor chip having a level shifter with first ESD discharge circuit displayed with a dot-arrow, A→A' has a high resistance element. The first ESD discharge path (A→A') has a high metal interconnection wire resistance (hereinafter referred to as a first resistance) 130 and a back-to-back diode 140 wherein a resistance of both added is very big. The metal interconnection wire resistance herein is a metal interconnection wire resistance for routing.

For example, when ESD stress current is applied, namely, the stress current meets various components present in the A→A' current path. The components comprise first ESD clamp 110, first resistor 130, back-to-back-diode 140. Each component has resistance. Due to the resistance of each component, there are several voltage drops in the A→A' current (or signal) path. The sum of voltage drop appears around 40V in the A→A' signal path. In case, a reference voltage is applied to the high voltage ground pad 150 and ground reference 155 and a plus ESD stress zapping (+ Zapping) is applied to the low voltage input pad 100, there are a first voltage drop by first ESD clamp 110 which is about 4V and a second voltage drop by first resistor 130 which is about 30V (assuming about 30 Ohm, around 1 A) and a third voltage drop by the back-to-back diode 140 which is around 6V.

Total voltage drop about 40V(=4V+30V+6V) is present to a first ESD discharge path (A→A') from the low voltage input pad 100 to a high voltage ground pad 150 therebetween. However, not only a discharge path A→A' but also an equivalent circuit B→B' that pass through the level shift is formed between the low voltage input pad 100 and a high voltage ground pad 150. This also means that a second ESD discharge path B→B' also has stress under an equivalent 40V voltage drop in the signal line. In other words, about 40 V voltages are applied also to a gate electrode 360 of the semiconductor device.

An identical voltage drop is applied to an inverter 180 but there is no problem when stress flows in an inverter device. Because the ESD discharge path is designed to easily flow to a substrate region passing through source/drain region. In other words, the ESD discharge path is designed to easily flow out to the substrate region through an N type well or a P type well region surrounding the source/drain region. Accordingly, the inverter device is not destroyed although ESD/EOS stress occurs. Further, the inverter 180 can be discharged with the first ESD clamp 110 although stress is applied because of a first ESD clamp 110 connected in parallel.

Likewise, 40V voltage drop is directly applied to the semiconductor device 170 passing the inverter 180. This eventually enables a high voltage applied to a gate insulating layer formed between a gate and a substrate of the semiconductor device 170. Herein, a thin gate insulating layer 340 (FIG. 3) included in the semiconductor device 170 may be easily destroyed because the thickness is so thin that cannot bear 40V voltage. To prevent destroying the insulating layer 340, a resistor 104 of a polysilicon resistor having high resistance may be arranged between a low voltage input pad 100 and the semiconductor device 170. This is to prevent the flow of the ESD stress to the B→B' path including the semiconductor device 170 due to the resistor 104 element. The resistor 104 is often used to protect a core block, i.e. a gate insulating layer of a core device. However, since the resistor 104 is arranged far from the semiconductor device 170, hence controlling Charged device model (CDM) ESD stress occurred near the semiconductor device 170 is difficult. The Charged Device Model (CDM) event is widely recognized as the "real-world" ESD failure mode. The primary CDM failure mechanism is attributed to dielectric failure, such as gate-oxide breakdown due to voltage over stress, especially voltage overshoot.

For further explanation regarding CDM, a CDM ESD stress is formed inside a core circuit 800 aside from an ESD stress through external input pad. An IC with bigger size can store more static charge in the body, thereby can be applied as another ESD stress due to this static charge. For example, in the case of a high voltage device in many cases high voltage of 700V and etc. maybe applied. Hence, this kind of charges may be formed. Accordingly, in an embodiment of the present disclosure may include many static charges that my occur ESD stress between point "C" of FIG. 4, i.e. between the CMOS inverter 180 and the semiconductor device 170. Further, when a ground voltage is applied to the high voltage ground pad 150, electrons will immediately pass through the semiconductor device 170 and may flow out. Thereby, the semiconductor device 170 may be easily destroyed due to the thin gate insulating layer because of the CDM ESD stress. However, the afore-mentioned resistor 104 is separated far away hence hard to control.

Figure 5:
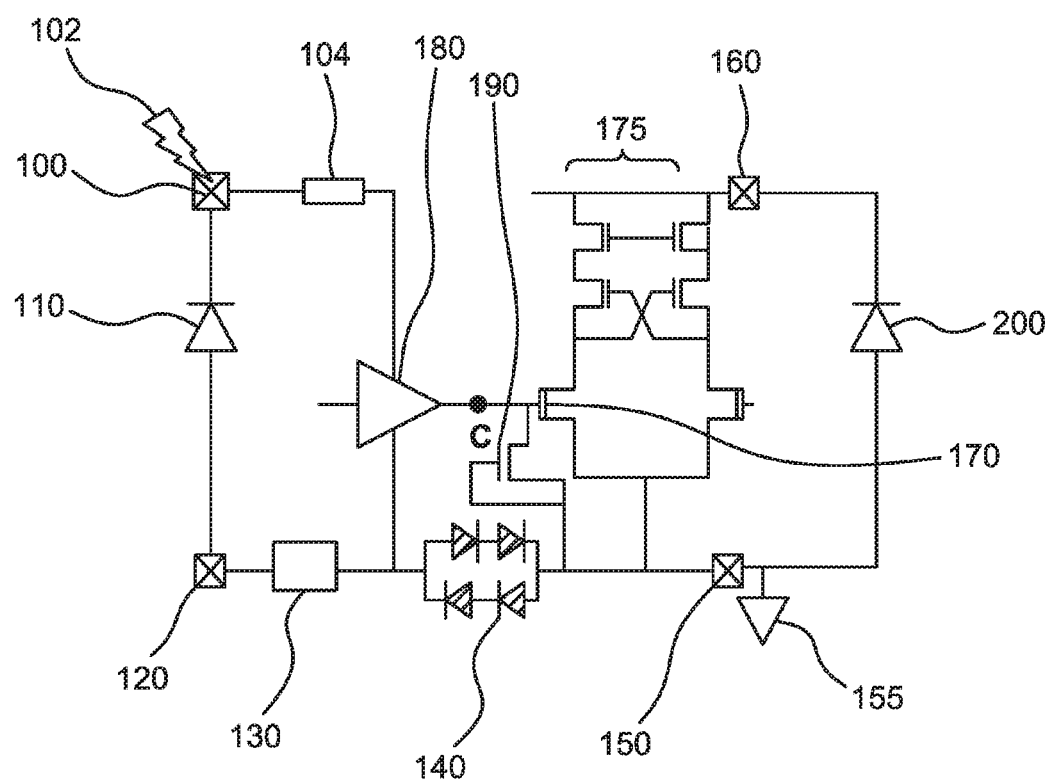
FIG. 5 is a semiconductor chip having a level shifter with an ESD circuit according to an embodiment of the present disclosure.

FIG. 5 shows a semiconductor chip with an ESD circuit to prevent this. An ESD clamp that can bear an ESD stress 102 is arranged near the semiconductor device 170. An ESD stress block clamp 190 is inserted directly in front of the semiconductor device 170. A third ESD clamp 190 that may be protected from the afore-mentioned CDM ESD stress refers to a low voltage clamp (small power clamp) device with a GGNMOS structure. This scheme may be a CDM (Charged device model) ESD protection circuit or device 190.

The main function of the third clamp 190 is protecting gate insulating layers 340, 350 of the semiconductor device 170. The third clamp 190 discharges a CDM ESD stress of a high voltage generated between an inverter 180 with a high voltage ground pad. Yet, a unit cell size of a level shift block 175 increases due to the third ESD clamp 190. Further, the chip size of products using many level shifters may increase, thereby cost competitiveness of a DDI chip included in a level shift may decrease. In other words, a CDM ESD protection clamp (small GGNMOS) may be included but there may be a problem that total area of a level shift block 175 may increase.

Figure 6:
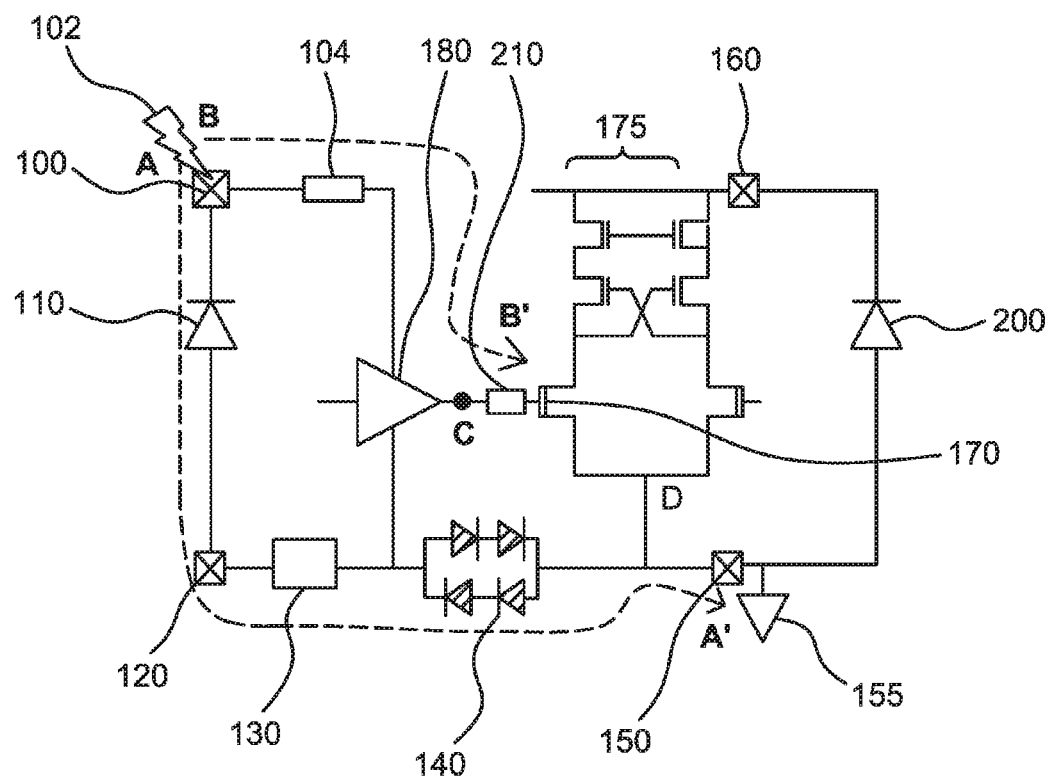
FIG. 6 is a semiconductor chip having a level shifter with an ESD circuit according to an embodiment of the present disclosure.

FIG. 6 is an optimized ESD circuit diagram for protection of a semiconductor device according to another embodiment of the present disclosure to solve the afore-mentioned problem. The circuit may protect the semiconductor device without the increase of the size of the level shift block 175. As illustrated in FIG. 6, a static discharge protection device is similar with FIG. 4 but different in that an ESD stress blocking region 210 that is electrically connected to the semiconductor device 170 is included.

The ESD stress blocking region 210 is formed between the CMOS inverter 180 and the semiconductor device 170. In other words, the ESD stress blocking region 210 is formed in the core circuit 800 like an internal circuit block such as the level shift block 175. A level shifter 175 comprises a semiconductor device 170 and an ESD stress blocking region 210. The ESD stress blocking region 210 is disposed adjacent to a gate electrode 360 of the semiconductor device 170. Resistance of the second path B→B' is higher than the first path A→A' because of the ESD stress blocking region 210. When an ESD stress 102 is applied to a low voltage input pad 100, the ESD stress 102 applied to the semiconductor device 170 by the ESD stress blocking region 210 is blocked. In other words, the ESD stress is not easily applied to the gate electrode of the semiconductor device 170, because the ESD stress blocking region 210 has high resistance. Accordingly, the ESD stress blocking region 210 directly blocks the CDM ESD stress to flow into the gate electrode of the semiconductor device 170. Although the ESD stress 102 is input to the low voltage input pad 100 or the low voltage ground pad 120, the ESD stress is blocked because the ESD stress blocking region 210 has a high resistance. The ESD stress blocking region 210 has a very simple structure unlike a complicated structure of the aforementioned third ESD clamp. The ESD stress blocking region 210 comprises non-silicided poly-silicon layer which has higher resistance than the silicided poly-silicon layer. Non-silicided poly-silicon layer with higher resistance can block the ESD stress into the gate electrode of the semiconductor device 170, which results in increasing the ability of ESD protection. The ESD protection devices comprising the ESD stress blocking region 210 with non-silicide region (or layer) are strong to ESD stress 102 and results in protection of semiconductor device 170 from ESD stress, The ESD stress blocking region 210 and the semiconductor device 170 is illustrated as separated in FIG. 6. Yet this is for convenience of understanding, i.e. both may be formed in one feature wherein adjoining with each other that is an embodiment of the present disclosure. For example, as recited in FIG. 8 hereinafter, the ESD stress blocking region 210 is formed by directly arranging the ESD stress blocking region 210 on the gate electrode 360 of the semiconductor device 170. The ESD stress blocking region 210 is formed by increasing part of the gate electrode resistor through expanding the gate electrode of the semiconductor device 170. When arranging space is lacking, the ESD stress blocking region 210 may be formed physically separated from the gate electrode 360 of the semiconductor device 170 yet, electrically connected.

The ESD stress blocking region 210 has a higher resistor value than the first resistor 130. As afore-mentioned, the ESD stress blocking region 210 is directly connected to the gate electrode or physically separated. The ESD stress blocking region 210 is together formed with the gate electrode of the EDMOS device used as the semiconductor device 170. A poly-silicon material is used as a gate electrode of the EDMOS device thereby possible of simultaneously forming at the same step.

Further, in case of using ESD stress blocking region, resistance of first resistor 130 can be lowered around 1 ohm. If the lowered resistance of the first resistor 130 has been used, the voltage drop about 40V between the low voltage input pad 100 and the high voltage ground pad 150 may be decreased to 11V. It can be obtained by following calculation. Since first voltage drop by the ESD clamp 110 is around 4V and second voltage drop by the first resistor 130 is around 1V (1 Ohm, assuming 1 A) and third voltage drop by the back-to-back diode 140 is around 6V, total voltage drop about 11V (=4V+1V+6V) is obtained between the low voltage input pad 100 and the high voltage ground pad 150.

Likewise, reduction of resistance of the A→A' path (displayed in thick dotted line) is important. This helps discharging the ESD stress into the high voltage ground pad, because the A→A' path has a lower resistance path than the B→B' path. Consequently, nEDMOS semiconductor device, i.e. the semiconductor device 170 can be protected from the ESD stress.

Figure 7:
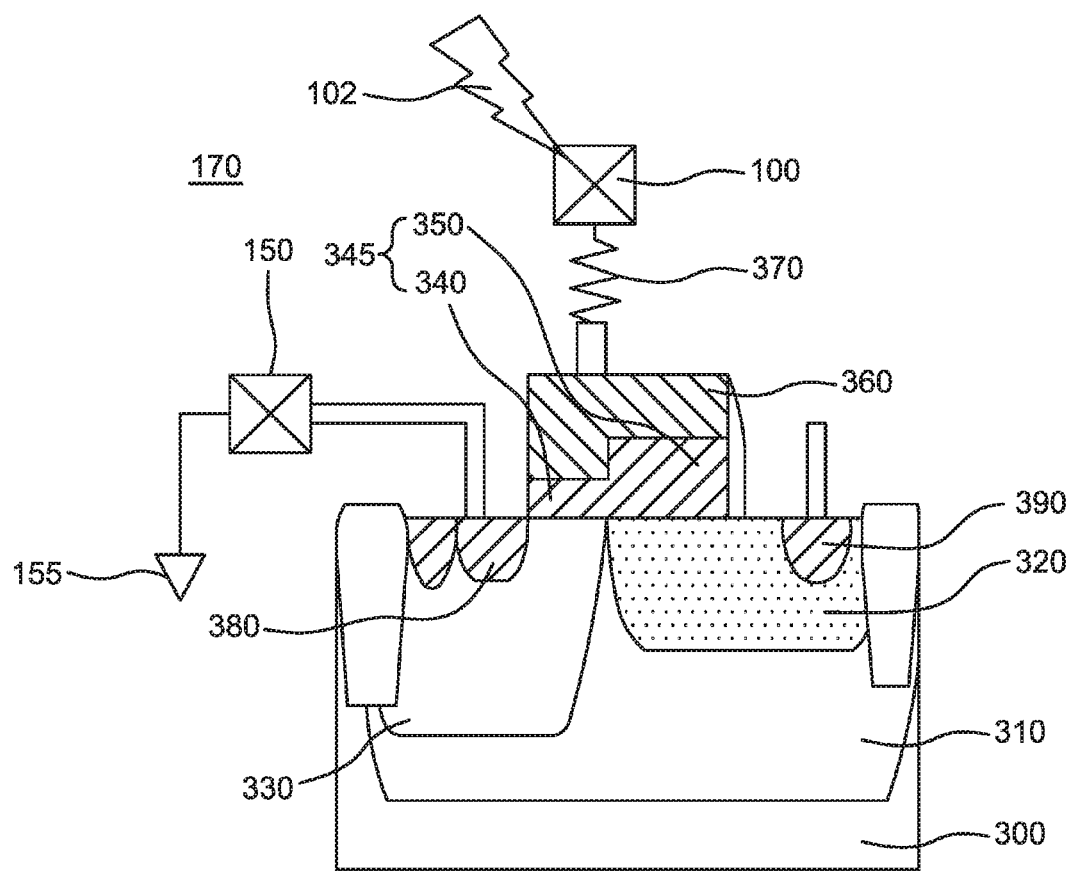
FIG. 7 is a cross-section of a semiconductor device with a gate protection region of an embodiment of the present disclosure.

FIG. 7 is a cross-sectional image regarding the semiconductor device 170 comprising a gate protection region 370 of an embodiment of the present disclosure.

The remaining main element illustrated in FIG. 7 is as illustrated in the afore-mentioned FIG. 3. Drawing code 330 is a P type body region 330 that is formed below a thin gate insulating layer 340 with a feature of a channel region. Further, the P type body region 330 is formed surrounding a source region 380 and contacts with an N type extension drain region 320. Without the P type body region 330, a P well region 310 may replace the channel region. Thus, the P type body region 330 is optional.

It is also different in that the thin gate insulating layer 340 may be protected from not only the ESD stress but also from noise by adding the gate protection region 370 between the low voltage input pad 100 and the gate electrode 360 of the semiconductor device 170. Herein, a resistance of 10 ohm~10 Kohm may be applied to the gate protection region 370 but various forms of resistor that can be configured in a semiconductor can also be applied. For example, as aforementioned, doped poly-silicon may be used as the gate protection region 370 as well as the gate electrode of nEDMOS device. Hence, there is an advantage in reduction of chip manufacture cost since the process is simplified. Further, the poly-silicon without silicide can be used as the gate protection region 370 with predetermined resistance. The gate protection region 370 has an identical function with the ESD stress blocking region 210 of FIG. 6 afore-mentioned herein.

FIGS. 8, 9, 10 and 11 is a plane view illustrating various features relating to the gate protection region of the semiconductor device of an embodiment of the present disclosure.

The gate protection region 370 of the semiconductor device of an embodiment of the present disclosure may be formed with various resistor values using various forms of poly-silicon and ion implantation method, and silicide blocking layer and etc.

Figure 8:
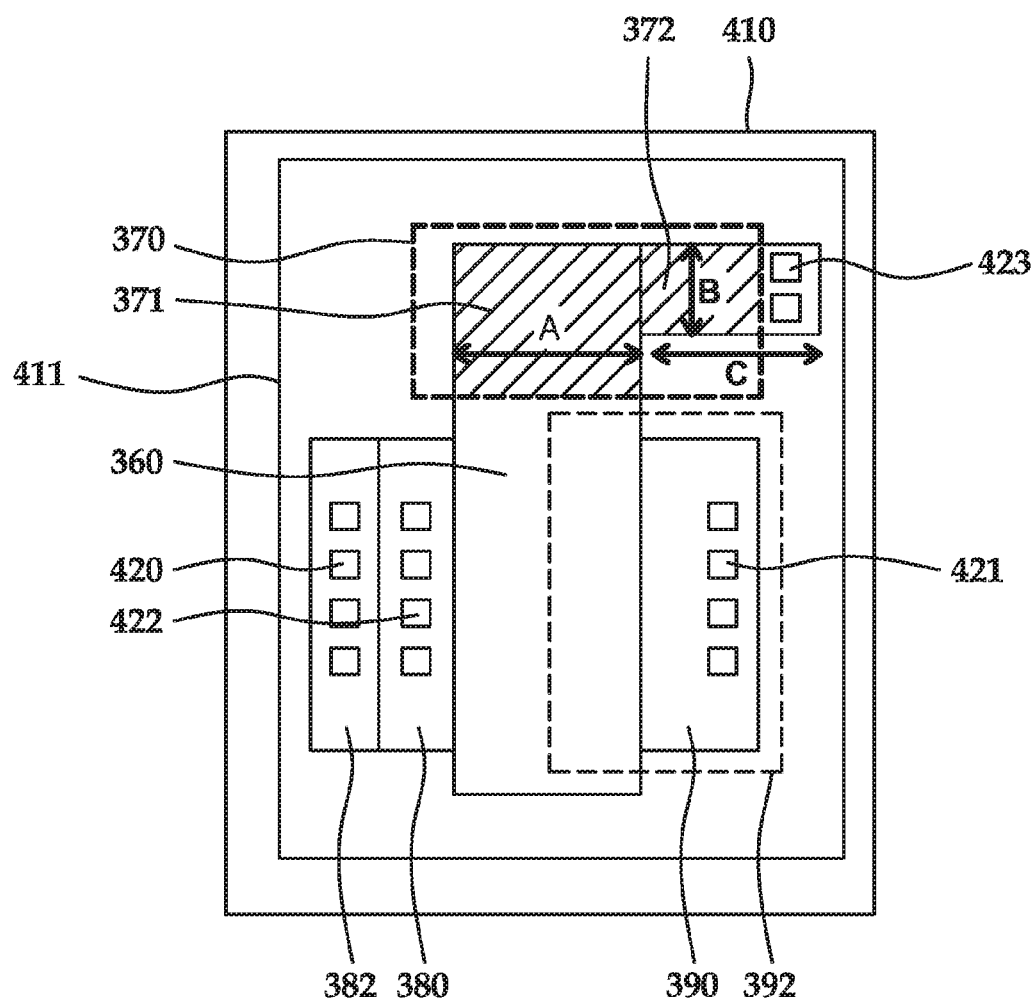
FIGS. 8, 9, 10 and 11 is a plan view of a semiconductor device with a gate protection region of a present disclosure.

First, FIG. 8 illustrates a low voltage P type well 411 formed on a DNW region 410 of a substrate region. A gate electrode 360 is formed in the P type well 411 thereof and a P+ contact region 420 is formed. Further, the gate protection region 370 contacting with the gate electrode 360 is formed. The gate protection region 370 is designated with a dotted box which is a non-silicide. In the other hand, the gate electrode 360 region may be formed with silicide layer (not shown).

Generally, CoSi$_2$ or NiSi and TiSi$_2$ may be uses as a silicide layer to decrease the gate resistance of the gate electrode 360. However, the gate protection region 370 is processed with the non-silicide. Silicide formation can be prevented by overlapping a silicide blocking layer (not shown) such as an oxide layer or a nitride layer for non-silicide process. Thus, resistance per unit area of the gate protection region 370 is higher than that of the gate electrode 360. Accordingly, resistance of the entire gate region increases and thereby the ESD stress may be relieved.

Moreover, a N+ source contact region 422, a N+ drain contact region 421 and a gate contact region 423 are respectively formed. The source/drain contact regions 422/421 and the gate contact regions 423 are processed with silicide. Single gate insulating layer 345 with different thickness comprising thin gate insulation layer 340 and thick gate insulation layer 350 is formed below the gate electrode 360. At the interface between thin gate insulation layer 340 and thick gate insulation layer 350, the thickness of gate insulation layer 345 is smoothly changed. Region displayed with the drawing code 392 refer to a mask region 392 that is to configure a thick gate insulating layer 350 region. Hereinafter, FIG. 9~FIG. 11 omitted explanation regarding the same drawing code.

The gate protection region 370 is also formed with a poly-silicon which is a material identical with the gate electrode 360. Height of the second resistor region 370 and the gate electrode 360 is identical because they are formed in the same step. The gate protection region 370 includes a first region 371 extending in a longitudinal direction (perpendicular direction with drain) of the gate electrode 371 and a second region 372 with predetermined width extending in a perpendicular direction (drain direction) of the first region 371. Herein, the second region is additionally formed to further increase the gate resistance when the gate protection region generated by the first region 371 is not enough. However, when enough gate protection region can be received with the first region 371 only, the second region 372 may not be necessary. Because there may be a problem of further increase of the entire area of the gate electrode because of the second region 372.

The second region 372 may be formed with a smaller width (B) than that of length (C), thereby further increasing the gate resistance. As illustrated, the poly horizontal length of width (B) is formed with a minimum line width wherein supported by the related technology node and the form of the resistor is formed long in a drain direction to minimize the area of the semiconductor device.

Likewise, as illustrated in various embodiments, the gate protection region 370 may be formed in a bar-type to form maximum resistor and may increase actual resistor value by forming a resistor in various forms of "┐", "└", "ㄷ", and "ㅌ" according to an embodiment of the present disclosure. The present disclosure according to the above feature protects the thin gate insulating layer 340 from the ESD stress and noise by adding the gate protection region 370 on the semiconductor device 170.

Figure 9:
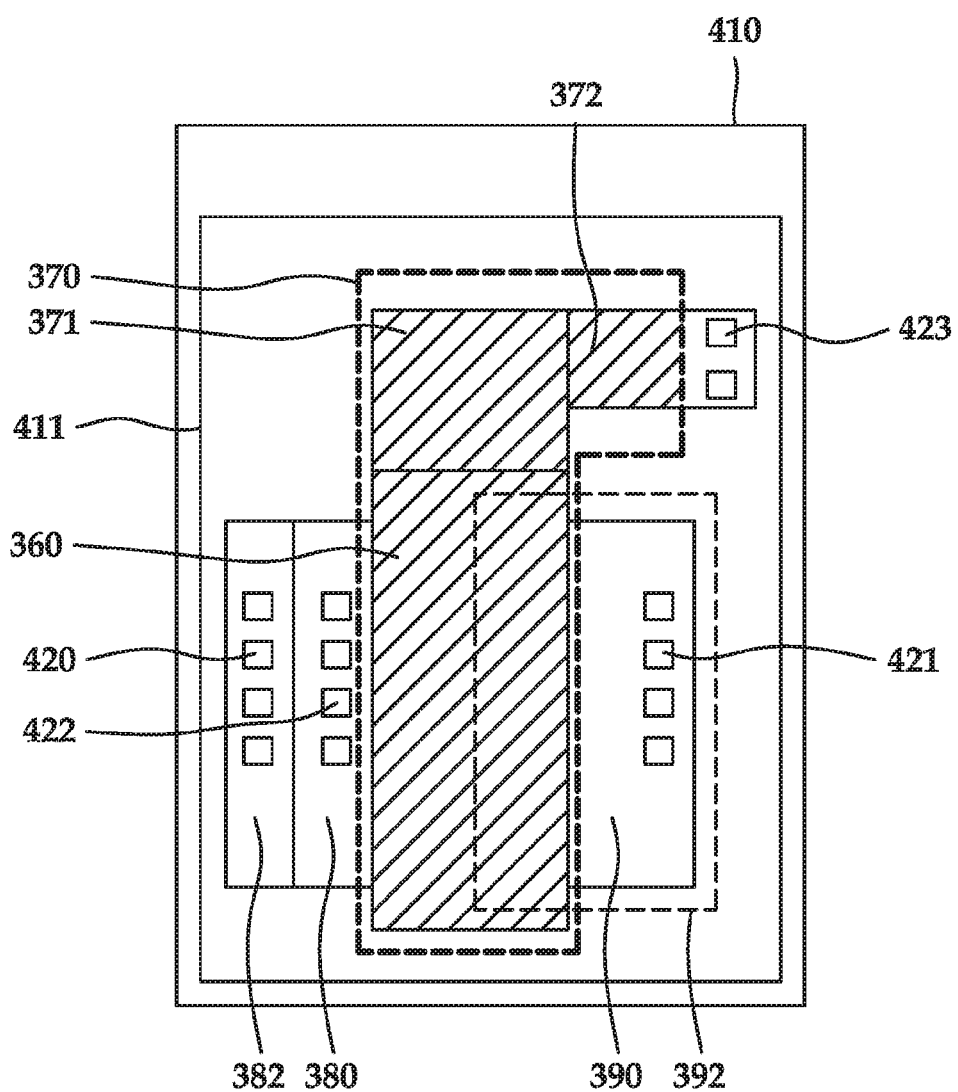

FIG. 9 is similar to FIG. 8 which is an extension of the non-silicide region. FIG. 8 illustrates the non-silicide region formed using a silicide protection layer in part of a region to form a gate protection region 370. However, FIG. 9 formed a silicide protection layer in almost all regions of a poly-silicon except only a part of the region. Thereby, forms the gate protection region 370 so that the poly-silicon surface becomes a non-silicide. In other words, FIG. 9 forms a silicide formation block layer to the entire region that is used as the gate electrode 360, thereby shifts into a non-silicide region. Thereby, a higher gate resistance than illustrated in FIG. 8 can be obtained.

Figure 10:
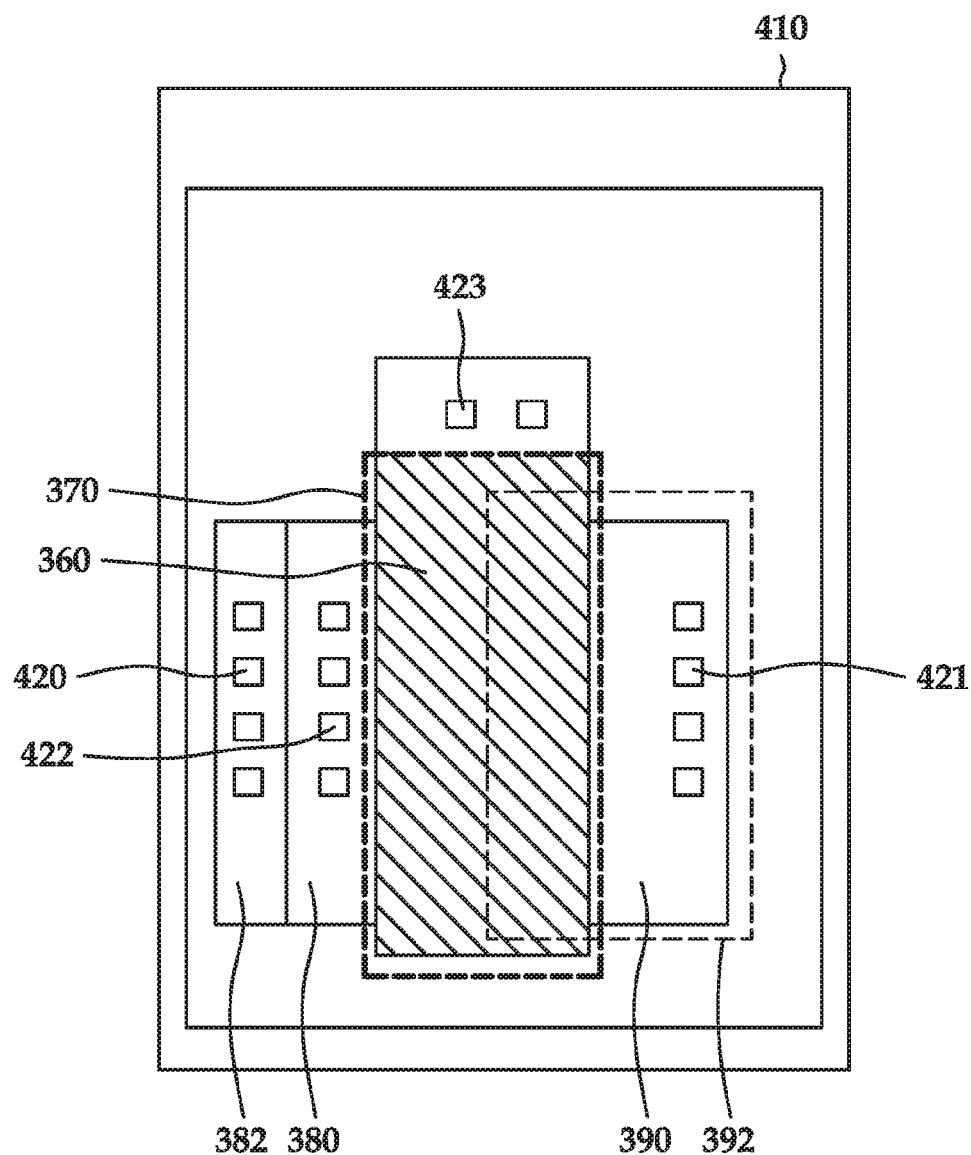

FIG. 10 illustrates a gate area more minimized than FIG. 8 and FIG. 9 and can efficiently use when the gate electrode 360 allowing area is limited in terms of design. In other words, a region configured to increase resistor next to the gate electrode 360 as illustrated in FIG. 8 or FIG. 9 may not be formed easily. It is similar that the gate electrode 360 is changed to a non-silicide region as a whole. Thereby, the gate protection region 370 may include all of the gate electrode 360 of the semiconductor device in the semiconductor device. This is to maximize resistance value in the provided cell size. Although gate resistance is higher, EDMOS device feature with level shift function is not affected.

Figure 11:
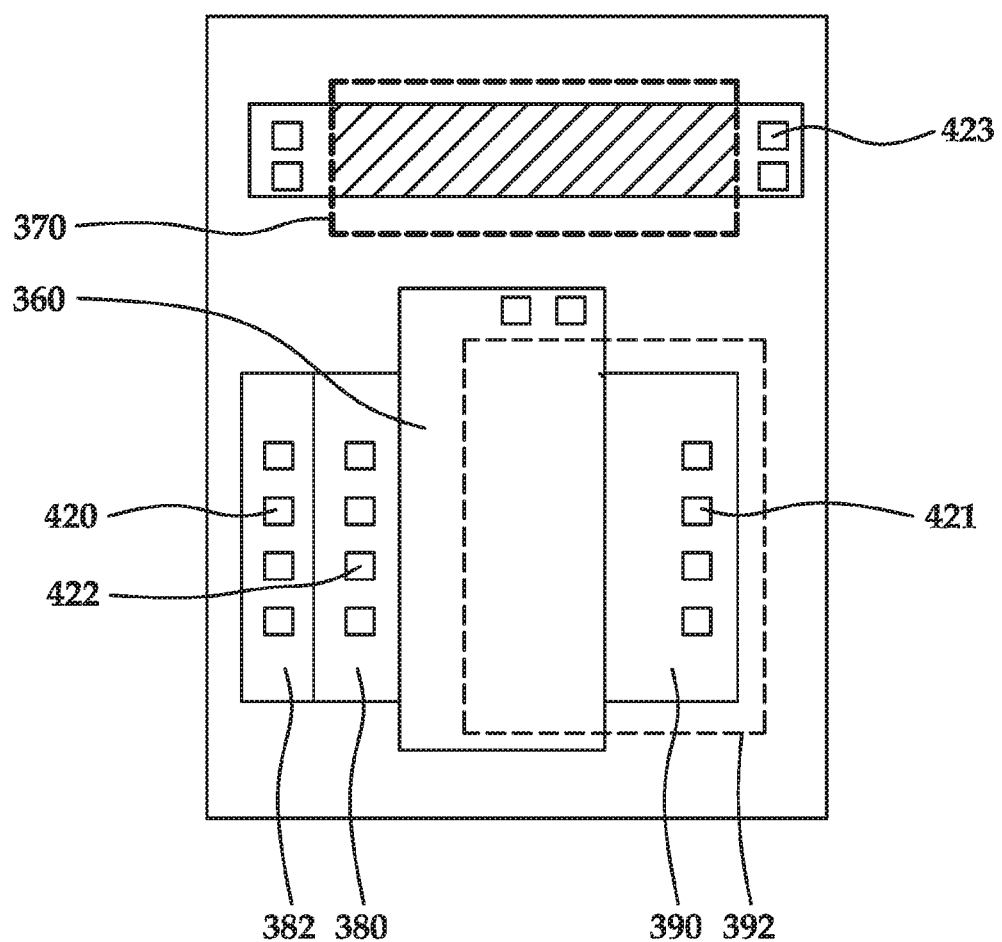

Unlike the afore-mentioned FIG. 8 to FIG. 9, FIG. 11 may not form the gate protection region 370 next to the gate electrode 360. Accordingly, the gate electrode region 360 and the gate protection region 370 may be formed separated from each other with a predetermined distance. Although they are separated, the afore-mentioned regions may be connected using a metal interconnection wire. Thus, the gate electrode 360 and the gate protection region 370 may be electrically connected. If they are formed separated, the structure becomes further immune to the ESD stress. If there are defects in the gate electrode 360 that is used in the semiconductor device, the ESD stress is applied to the direction of the gate electrode 360. However, when the gate electrode 360 and the gate protection region 370 are formed separated from each other, the ESD stress is already blocked in the gate protection region 370, thereby may have a more stable ESD immunity capability.

The afore-mentioned FIG. 8 to FIG. 11 discloses an embodiment of a method protecting an insulating layer from an ESD stress through forming a gate protection region 370 mainly using non-silicide. Hereinafter the present disclosure relates to all process method that can further increase additional resistor to block a flow of the ESD stress to a gate electrode that is used in a semiconductor device. In other words, all process methods that may increase a resistor applied to a poly-silicon layer used as a gate electrode material are included. There is a method of ion injecting N+/P+ dopant to the gate electrode to increase gate resistance. i.e., counter doping method is used. Ion implantation process to lower resistor to a gate electrode can be skipped. High-R resistor ion implantation process can also be used.

First, a counter doping method wherein ion injecting both N+/P+ dopants to the gate electrode is ion injecting both N type dopant or P type dopant after a poly-silicon is formed on the gate electrode 360 and the gate protection region 370. Thus, entire doping concentration is maintained with 1E15~1E20 atoms/cm3, thereby gate protection region 370 with low gate resistance (total of the first gate resistance and the second gate resistance) is formed. Generally, NMOS device and PMOS device respectively require N type or P type high concentration source/drain region when forming a CMOS device. Step of N+ ion implantation and P+ ion implantation are respectively included. Mask may be opened to apply both N+ ion implantation step and P+ ion implantation step to the resistor forming region of the present disclosure. Thus, net doping concentration of the gate electrode and the gate protection region may be 1E15~1E20 atoms/cm3 by a counter doping.

In other words, N+ and P+ dopants are ion implanted respectively to an identical resistor region and counter doped, thereby determining net-doping level. For example, when P+ doping concentration is 2E18 atoms/cm3 and N+ doping concentration is 2.5E18 atoms/cm3, entire net doping concentration is 5E17 atoms/cm3 and gate protection region with higher gate resistance can be formed due to decreased doping concentration. Any ion implantation or doping process can be applied in an original CMOS process.

The second method for increasing the gate resistance by skipping a part of the ion implantation process. Generally, necessary processes of forming the gate electrode and pre-doping step are proceeded to decrease gate electrode resistor. The gate resistance does not decrease when these processes are not implemented. A doping concentration implanted to the gate electrode 360 and the gate protection region 370 decreases accordingly, thereby total gate resistance increases.

Another method is increasing gate resistance using High-R ion implantation process. A gate resistance formation process and high resistance formation process are implemented at the same time to increase the gate resistance. Thereby, entire manufacture cost can be reduced. For example, high-R resistor forming process is one a semiconductor manufacture process. Polysilicon resistor having high resistance is a passive device that is selected when polysilicon resistor having high resistance is needed. Polysilicon resistor having high resistance is also formed with a poly-silicon thereby may be formed during the same step of the gate electrode forming process. The polysilicon resistor having high resistance forming process forms the poly-silicon through ion implantation process applied on the poly-silicon surface.

Hereinafter relates to a plane view of a back-to-back diode 140 illustrated in the afore-mentioned FIG. 4 to FIG. 6 through FIG. 12.

Figure 12:
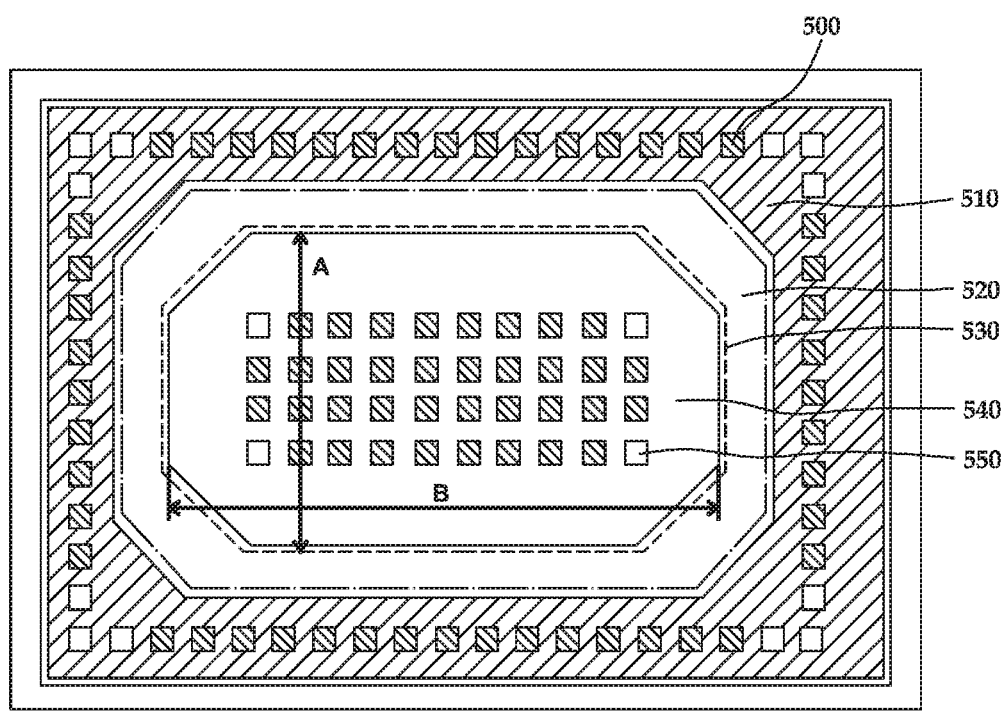
FIG. 12 is a plan view of an ESD protection diode of an embodiment of the present disclosure.

FIG. 12 is a diagram of an embodiment of an ESD protection diode layout suggesting that a circumference (A+B)×2 of an inner active of a back-to-back diode 140 may be over 100 um. In FIG. 12, drawing code 500 is P+ contact region, 510 is a P+ high concentration region, 520 is an insulation region (isolation, LOCOS, STI, MTI etc), 530 is a P well region, 540 is an N+ high concentration region, 550 is an N+ contact region. Back-to-back diode is used to reduce noise in a level shift block. The back-to-back diode is formed between the low voltage ground pad and the high voltage ground pad. A number of the back-to-back diode (refer to FIG. 6) herein may be used from terminal 1 to terminal 3 and the inner active circumference that is an anode of respective diodes should be at least 100 um to bear enough ESD stress. For easy release of an ESD stress when ESD stress occurs, the number of diodes (or the number of series) may be the fewer the better. Because, the fewer the number of diodes, the smaller the resistance. Hence, the ESD stress may be released easier.

Figure 13:
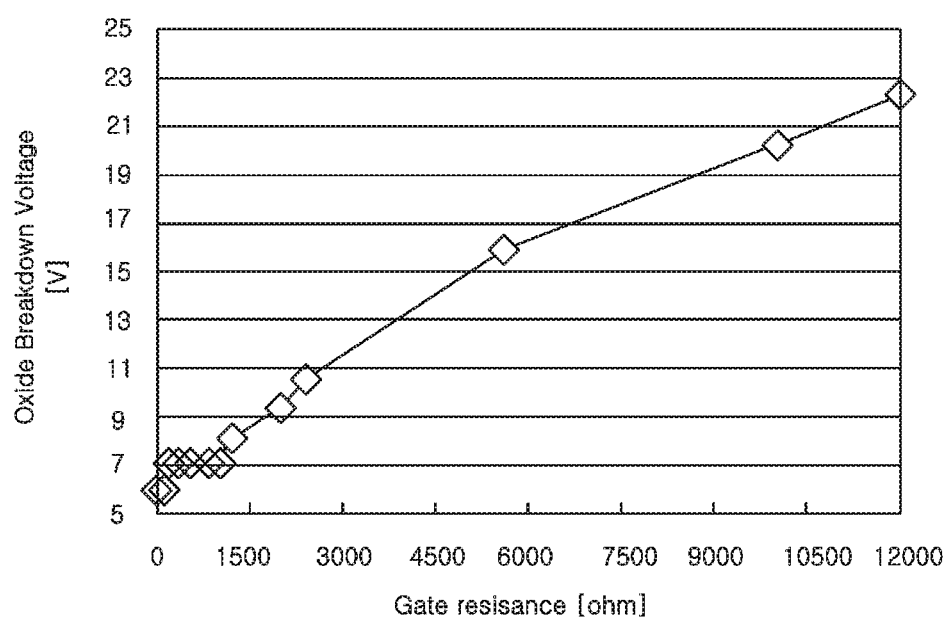
FIG. 13 is a graph illustrating a breakdown voltage of a gate insulating layer according to size of a gate protection region of an embodiment of the present disclosure.

FIG. 13 is a graph illustrating a breakdown voltage of gate insulation layer according to a gate resistance value when transmission line pulsing (TLP) is applied with 100 nsec duration. As illustrated, when a gate protection region connected to the semiconductor device of an embodiment of the present disclosure increases, the breakdown voltage of the gate insulating layer also increases accordingly. Oxide breakdown voltage increases according to increase of the gate resistance. Actual measurement is measuring external resistor arranged on a gate front terminal of the semiconductor device which has an identical effect with adding the gate protection region during circuit layout. Additionally, the methods controlling the resistance of poly-silicon gate are applying a non-silicide process, or a counter doping, or a High-R resistor ion implantation process to a level shift semiconductor device's gate electrode. Moreover, method of skipping ion implantation process to make higher resistance of the gate electrode may be applied. All processes that increase resistance of the gate electrode and the gate protection region are included. Increasing resistance of the gate region including the gate electrode and the gate protection region may protect the thin gate insulating layer 340 as well as the thick gate insulation layer 350 of the semiconductor device (to be protected device) through the above-mentioned processes.

Figure 14:
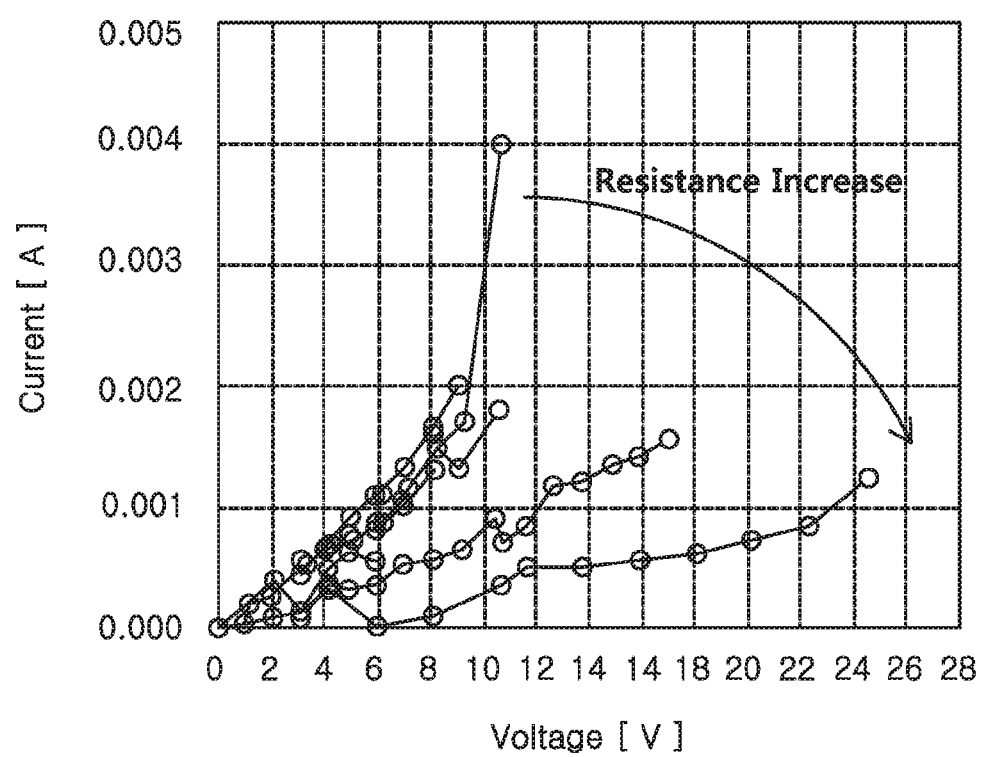
FIG. 14 is a graph illustrating a voltage-current applied to a gate of a semiconductor device of an embodiment of the present disclosure.

FIG. 14 illustrates a graph of TLP current-voltage of 100 nsec pulse according to a gate protection region of the semiconductor device. Gate resistance is changed from 390 ohm to 12,000 ohm. Additionally, a current flowing through the gate electrode while increasing respective voltages of 390 ohm to 12,000 ohm are monitored. Consequently, the flowing current value decreases proportionate to the gate resistance. In other words, the ESD stress immunity capability increases according to increasing gate resistance.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a source region and a drain region formed in a substrate;
   a gate dielectric layer comprising a thin gate dielectric layer and a thick gate dielectric layer formed on the substrate;
   a non-silicided polysilicon layer comprising a polysilicon layer counter doped with different types of dopant ions and having no silicide layer formed on the polysilicon layer, the non-silicided polysilicon layer being formed on the thin and thick gate dielectric layers;
   a silicided polysilicon layer comprising a silicide layer formed on the polysilicon layer, the silicided polysilicon layer being formed adjacent to the non-silicided polysilicon layer to abut the non-silicided polysilicon layer; and
   a silicide blocking layer formed on the non-silicided polysilicon layer to prevent the silicide layer being formed on the non-silicided polysilicon layer,
   wherein the non-silicided polysilicon layer is doped with a first type of dopant and a second type of dopant different from the first type of dopant, and no silicide layer is formed on the counter doped polysilicon layer.

2. The semiconductor device of claim 1, further comprising a first conductivity type body region formed in the substrate.

3. The semiconductor device of claim 1, further comprising:
   a first conductivity type well region formed in the substrate; and
   a second conductivity type extension drain region formed in the first conductivity type well region.

4. The semiconductor device of claim 3, wherein the source region is formed in the first conductivity type well region, and the drain region is formed in the second conductivity type extension drain region.

5. A semiconductor device, comprising:
   a substrate having an active region and an isolation region;
   a source region and a drain region formed in the substrate;
   a gate dielectric layer comprising a thin gate dielectric layer and a thick gate dielectric layer formed on the substrate;
   a non-silicided polysilicon layer comprising an undoped polysilicon layer formed on the thin and thick gate dielectric layers;
   a silicided polysilicon layer formed adjacent to the non-silicided polysilicon layer and electrically connected to the non-silicided polysilicon layer; and
   a silicide blocking layer disposed on the non-silicided polysilicon layer,
   wherein the non-silicided polysilicon layer disposed between the source and drain regions has a total surface area greater than a total surface area of the silicided polysilicon layer in a plan view.

6. The semiconductor device of claim 5, wherein the undoped polysilicon layer comprises a polysilicon resistor having a resistance higher than that of the silicided polysilicon layer.

7. The semiconductor device of claim 5, further comprising a first conductivity type well region formed in the substrate and a second conductivity type extension drain region formed in the first conductivity type well region, and
wherein the second conductivity type extension drain region has a depth smaller than a depth of the isolation region.

8. The semiconductor device of claim 7, wherein the source region is formed in the first conductivity type well region and the drain region is formed in the second conductivity type extension drain region.

9. A semiconductor device, comprising:
a substrate having an active region and an isolation region;
a first conductivity type well region formed in the substrate and having a depth greater than a depth of the isolation region;
a first conductivity type body region and a second conductivity type extension drain region respectively formed in the first conductivity type well region;
a silicided source contact region and a silicided drain contact region formed on the substrate;
a gate dielectric layer comprising a thin gate dielectric layer and a thick gate dielectric layer and formed on the first conductivity type well region on the substrate;
a non-silicided polysilicon layer comprising a polysilicon layer with no silicide layer formed on the polysilicon layer, the non-silicided polysilicon layer being formed on the gate dielectric layer; and
a silicided polysilicon layer comprising a silicide layer formed on the polysilicon layer, the silicided polysilicon layer being formed adjacent to the non-silicided polysilicon layer to abut the non-silicided polysilicon layer,
wherein the second conductivity type extension drain region abuts the first conductivity type body region, and has a depth smaller than a depth of the isolation region.

10. The semiconductor device of claim 9, further comprising a silicide blocking layer formed on the non-silicided polysilicon layer to prevent the silicide layer being formed on the non-silicided polysilicon layer, wherein the non-silicided polysilicon layer is counter doped with different types of dopant ions to have a resistance higher than that of the silicided polysilicon layer to form a gate protection region.

11. The semiconductor device of claim 9, wherein the silicided source contact region is formed in the first conductivity type body region and the silicided drain contact region is formed in the second conductivity type extension drain region.

* * * * *